United States Patent [19]

Baek et al.

[11] Patent Number: 5,705,403

[45] Date of Patent: Jan. 6, 1998

[54] METHOD OF MEASURING DOPING CHARACTERISTIC OF COMPOUND SEMICONDUCTOR IN REAL TIME

[75] Inventors: Jong-Hyeob Baek; Bun Lee, both of Yusong-ku; Jin-Hong Lee, Kangnam-ku; Sung-Woo Choi, Yusong-ku, all of Rep. of Korea

[73] Assignee: Electronics and Telecommunications Research Institute, Daejeon-shi, Rep. of Korea

[21] Appl. No.: 696,092

[22] Filed: Aug. 13, 1996

[30] Foreign Application Priority Data

Dec. 20, 1995 [KR] Rep. of Korea ............... 95-52674

[51] Int. Cl.⁶ ................................................ H01L 21/00
[52] U.S. Cl. ...................................... 437/7; 437/8; 117/85
[58] Field of Search ........................... 437/7, 8; 117/85

[56] References Cited

U.S. PATENT DOCUMENTS

| | | | |
|---|---|---|---|
| 4,812,650 | 3/1989 | Eckstein et al. | 117/85 |
| 5,091,320 | 2/1992 | Aspnes et al. | 437/8 |
| 5,166,080 | 11/1992 | Schietinger et al. | 437/7 |
| 5,232,547 | 8/1993 | Drowley et al. | 437/8 |
| 5,277,747 | 1/1994 | Aspnes | 437/8 |
| 5,387,309 | 2/1995 | Bobel et al. | 117/85 |
| 5,456,205 | 10/1995 | Sheldon | 117/85 |
| 5,463,977 | 11/1995 | Manada et al. | 117/85 |
| 5,552,327 | 9/1996 | Bechmann et al. | 117/85 |

FOREIGN PATENT DOCUMENTS 6097253  4/1994  Japan ............... 117/85

*Primary Examiner*—Charles L. Bowers, Jr.
*Assistant Examiner*—Ramamohan Rao Paladugu
*Attorney, Agent, or Firm*—Antonelli, Terry, Stout & Kraus, LLP

[57] ABSTRACT

A method of sensing the concentration of a doped impurity on a semiconductor in real time and a method of sensing the change of its growth rate dependent on time among the changes of the growing conditions due to doping by using a real time analysis apparatus in growing a heterostructured semiconductor by a MOCVD method. A reflecting signal during the growth by means of a real time analysis apparatus has a periodic property, an amplitude change of a reflecting signal is dependent on an absorption coefficient when an absorption exists on an epitaxial layer, an impurity concentration can be obtained by using the relation of an absorption coefficient and an impurity concentration. In addition, if each peak is independently analyzed, the respective growth rate dependent on time are measured individually, so that the reduced growth rate dependent on time of the growth rate is sensed in a carbon doped AlAs layer.

5 Claims, 4 Drawing Sheets

METHOD OF MEASURING DOPING CHARACTERISTIC OF COMPOUND SEMICONDUCTOR IN REAL TIME

BACKGROUND OF THE INVENTION

The present invention generally relates to a method of sensing the doping characteristic of a compound semiconductor, and more particularly, to a method of sensing in real time the doping characteristic of a compound semiconductor in growing an epitaxial layer of a semiconductor by using a MOCVD (Metal Organic Chemical Vapor Deposition) growth method.

It has been and will be continuously studied for more efficient elements to grow an epitaxial layer of an electron and photon structure on GaAs and InP substrates by using a MOCVD method, that is, a semiconductor hetero thin film growth method.

A pure semiconductor is an insulator which does not have current flowing therein. To apply it as an electrical element, an impurity must be artificially applied to the insulator. Such a method is called doping, which is an artificial method of adding a little impurity in a semiconductor and producing electrons or holes. An n type impurity is an electron producing impurity, a p type impurity is a hole producing impurity.

Without respect to either type of impurity, since conductivity is different according to a concentration of the impurity, the regulating of an impurity concentration is a basic skill in growing a doped epitaxial layer of a semiconductor, an impurity concentration can be analyzed by a special method after the growth thereof.

When a heavily concentration impurity is doped in a pure semiconductor, a lattice structure of a semiconductor interior is basically changed. This results in the changing of a growth rate and a composition and an optical constant. The above mentioned fact is well known in this skill field.

In the growth rate of impurities, there is not yet known for fact that a growth rate gradually decreases according to a growing time. There is known for fact that a growth rate of a carbon doped AlAs layer decreases more than that of a pure AlAs layer, however, this only refers to a thickness of an epitaxial layer after the completion of the growth.

A few well known impurity concentration analysis methods includes a Hall method, a secondary ion mass spectrometry method, a Polaron method, etc.

A Hall method is a measuring method measuring a concentration by the inclining degree of a magnetic field when electrons and holes are moving under the magnetic field.

It is necessary for such a method to perform a heat treatment after coating a conductive material on the surface of a sample for testing after completion of the growth, and then the subsidiary work for an electric line connection and an electrode contact.

A secondary ion mass spectrometry method is a counting method radiating ions on the surface of a sample for measurement, destructing the surface thereof, detecting a secondary ion through a detector, and counting ion quantity. The above analysis equipment is very expensive. Since a relative quantity of an impurity can be measured by the above method, it has a disadvantage that one must analyze it together with a reference sample of a known impurity concentration to know an absolute value thereof, and an absolute value of an unknown impurity concentration cannot be obtained. Also, it is difficult to detect a light doped impurity.

A Polaron method is an electrical measuring method similar to a Hall method, measuring the surface of capacitance and voltage at the same time, and is also called a C-V method.

The Polaron method has an advantage in that it is easy to analyze the concentration profile of an impurity, as in a secondary ion mass spectrometry method, because the concentration of an impurity on each surface of a sample is measured at the same time as etching the surface by a constant thickness by means of an etchant. But such step is not included in the Hall method.

As the secondary ion mass spectrometry and Polaron method are destructive tests, the sample once used in the tests are useless for further analysis.

The above three mentioned analysis methods are characterized after the completion of the growth of the expitaxial layer, and it is impossible to measure a doping concentration and the growth thickness in situations during the growth of the expitaxial layer.

In other words, the above described conventional methods have some problems in that the measured growth rate is actually a mean value because one can know only the whole thickness by using an electron microscope after the completion of the growth of the expitaxial layer, so that it is hard to obtain an accurate growth rate and modify the growth thickness in the case of a fine structured semiconductor layer.

SUMMARY OF THE INVENTION

It is an object of the present invention to provide a method of sensing a doping characteristic which can control an accurate growing variable by detecting every change of the expitaxial layer growth rate and doping concentration during growth of the expitaxial layer using real time laser reflectometry in growing an epitaxial layer by using an MOCVD method.

To accomplish the object of the present invention, in a method of sensing a doping characteristic of a compound semiconductor in real time, the method comprises the steps of:

mounting a compound semiconductor in a growing chamber of an epitaxy apparatus; injecting a reactive gas in the growth chamber; growing a heterostructured compound semiconductor layer;

scanning simultaneously a He—Ne laser beam and a diode laser beam from a laser apparatus on a surface of a compound semiconductor in said growth chamber; analyzing a reflectivity of the laser beam reflected thereon and a refraction ratio of an epitaxial layer; and analyzing a doping concentration and a growth rate of a compound semiconductor grown in real time.

BRIEF DESCRIPTION OF THE ATTACHED DRAWINGS

The present invention will now be described with reference to the drawings attached only by way of example.

DETAILED DESCRIPTION OF THE PREFERRED EMBODIMENT

Figure 1A:
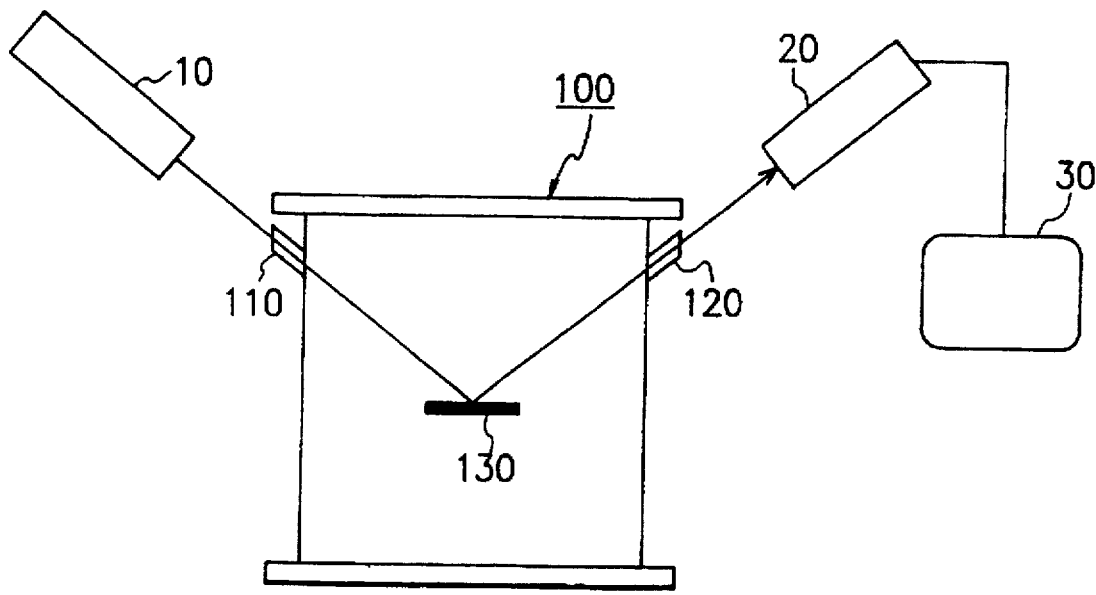
FIG. 1A is a schematic view to describe a real time reflectivity measuring apparatus used in the present invention.

FIG. 1A is a schematic view provided to describe a real time reflectivity measuring apparatus used in the present invention.

Referring to FIG. 1A, lasers 10 used in the present invention are a He—Ne laser and a diode laser. Their wavelengths are 0.6328 μm, and 1.53 μm, respectively.

When a compound semiconductor layer is grown, two laser beams simultaneously radiated in a growth chamber 100 from an outer source are incident on the surface of a compound semiconductor 130 through a side window 110, and reflected. After the reflected beams penetrate on another side window 120, they are detected by a detector 20, and are then transmitted in a computer 30, and then finally analyzed.

Figure 1B:
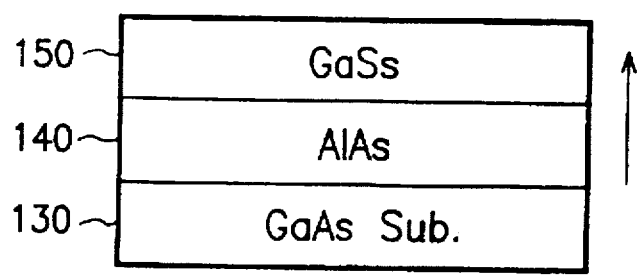
FIG. 1B is an enlarged view of a sample in a growth chamber in FIG. 1A.

FIG. 1B is a sectional view showing, in order, the growth of an AlAs layer 140 and a GaAs layer 150 on a compound semiconductor 130 mounted in the growth chamber 100.

In an embodiment of the invention, first, an AlAs layer 140 is grown on a GaAs substrate as an epitaxial layer 130 and then a GaAs layer 150 is grown on the AlAs layer.

The thickness of the respective epitaxial layers is a few μm, and a doping characteristic of a compound semiconductor substrate 130 can be analyzed by such thickness.

Figure 2:
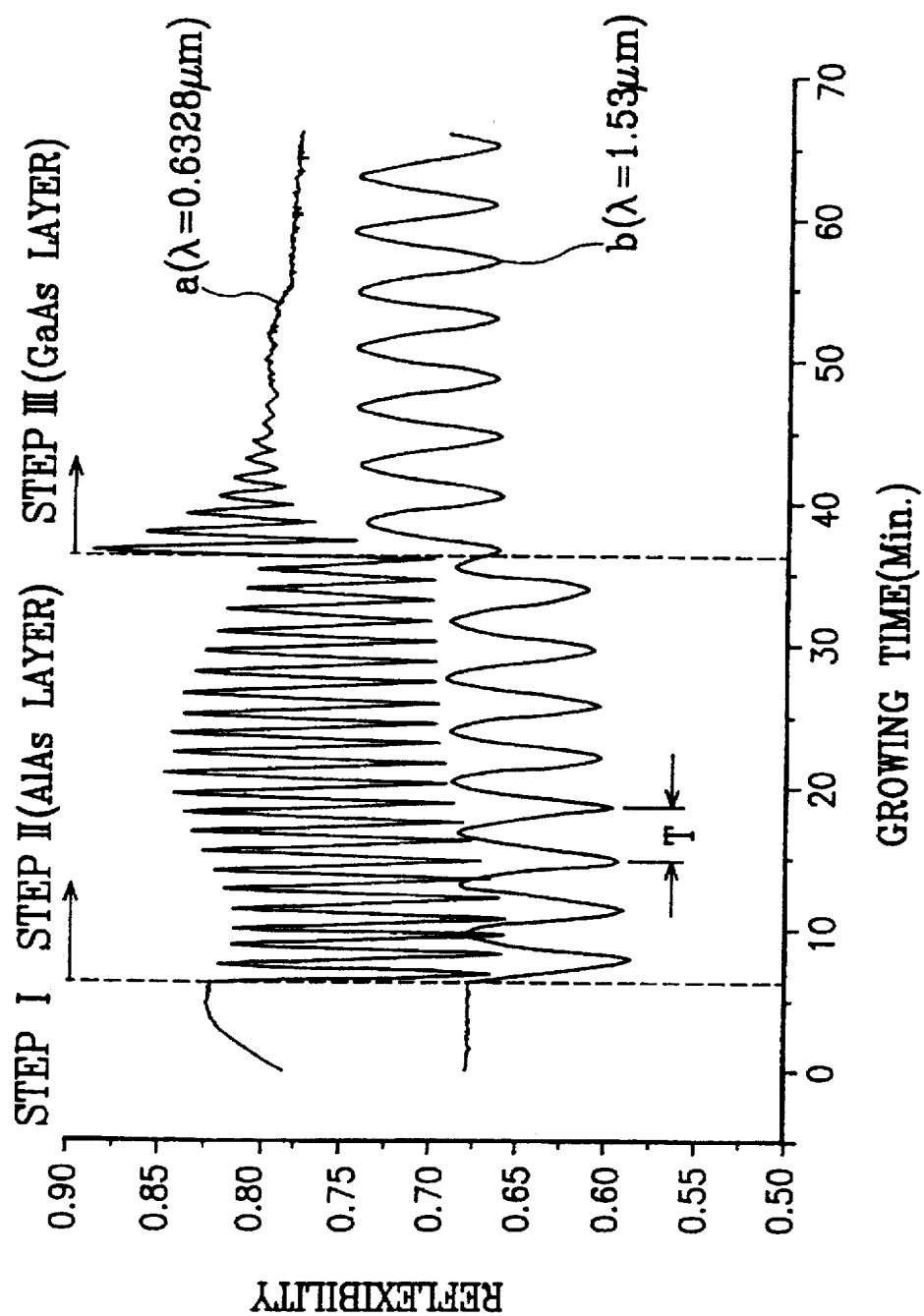
FIG. 2 shows data providing the reflectivity of a laser reflecting signal depending on a growing time of an undoped epitaxial layer.
Figure 3:
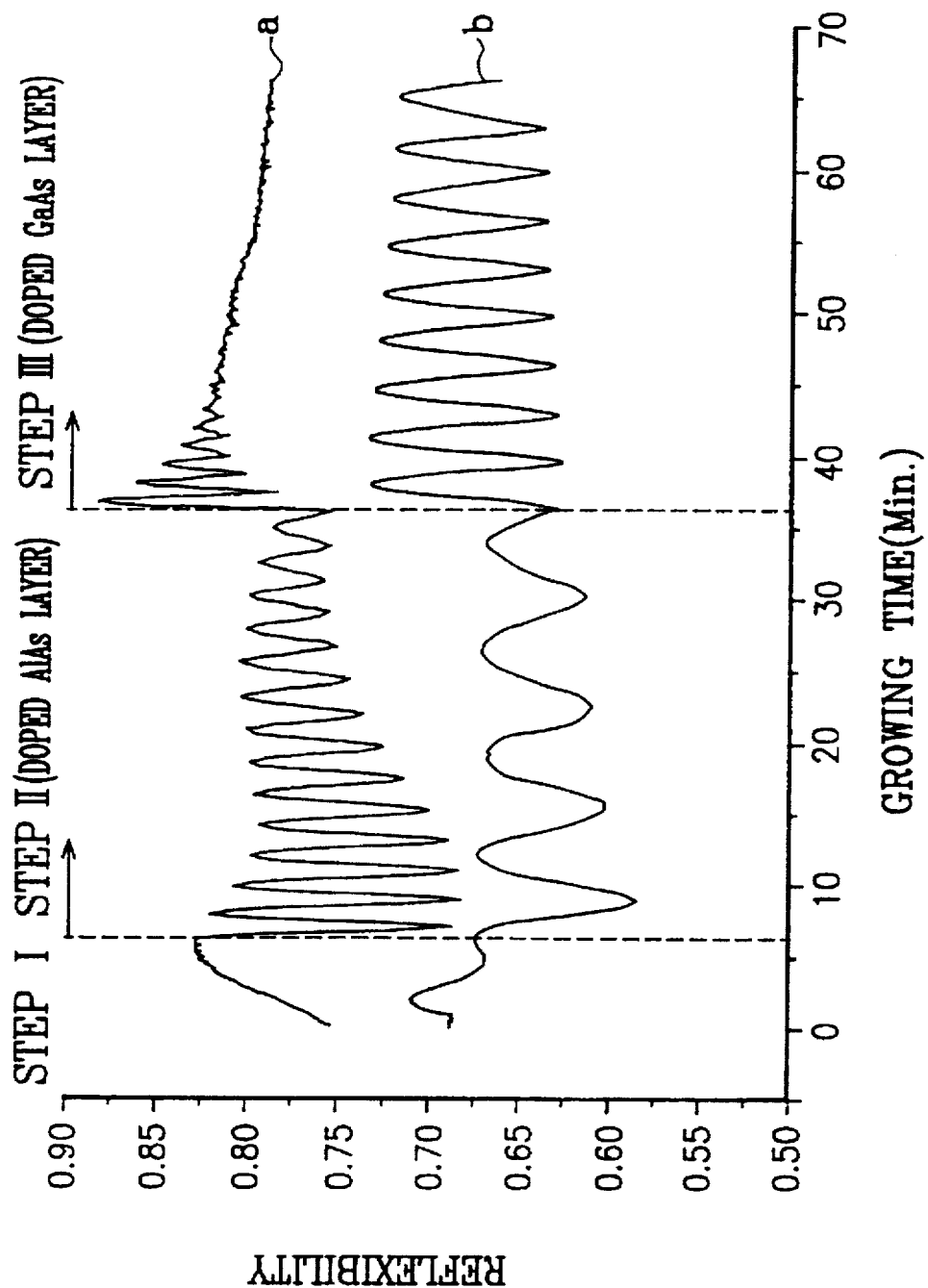
FIG. 3 shows data providing the reflectivity of a laser reflecting signal depending on the growth time of a doped epitaxial layer.

FIGS. 2 and 3 show data providing the changing of reflectivity of a laser reflecting signal depending on the growth time in a growth chamber during the growth.

FIG. 2 shows a reflectivity in growing a pure AlAs layer 140 and a GaAs layer 150.

FIG. 3 shows a reflectivity in growing an epitaxial layer doped with Carbon at $10^{19}$ per $cm^3$.

The reflectivity to two lasers are shown in each figure. The growing steps are divided into three steps, wherein step I is a growth preparation step which increases a substrate temperature to a growth temperature and grows a high quality buffer layer, step II is the growth step of an AlAs layer, and step III is the growth step of a GaAs layer. The steps I–III were processed continuously.

Figure 4:
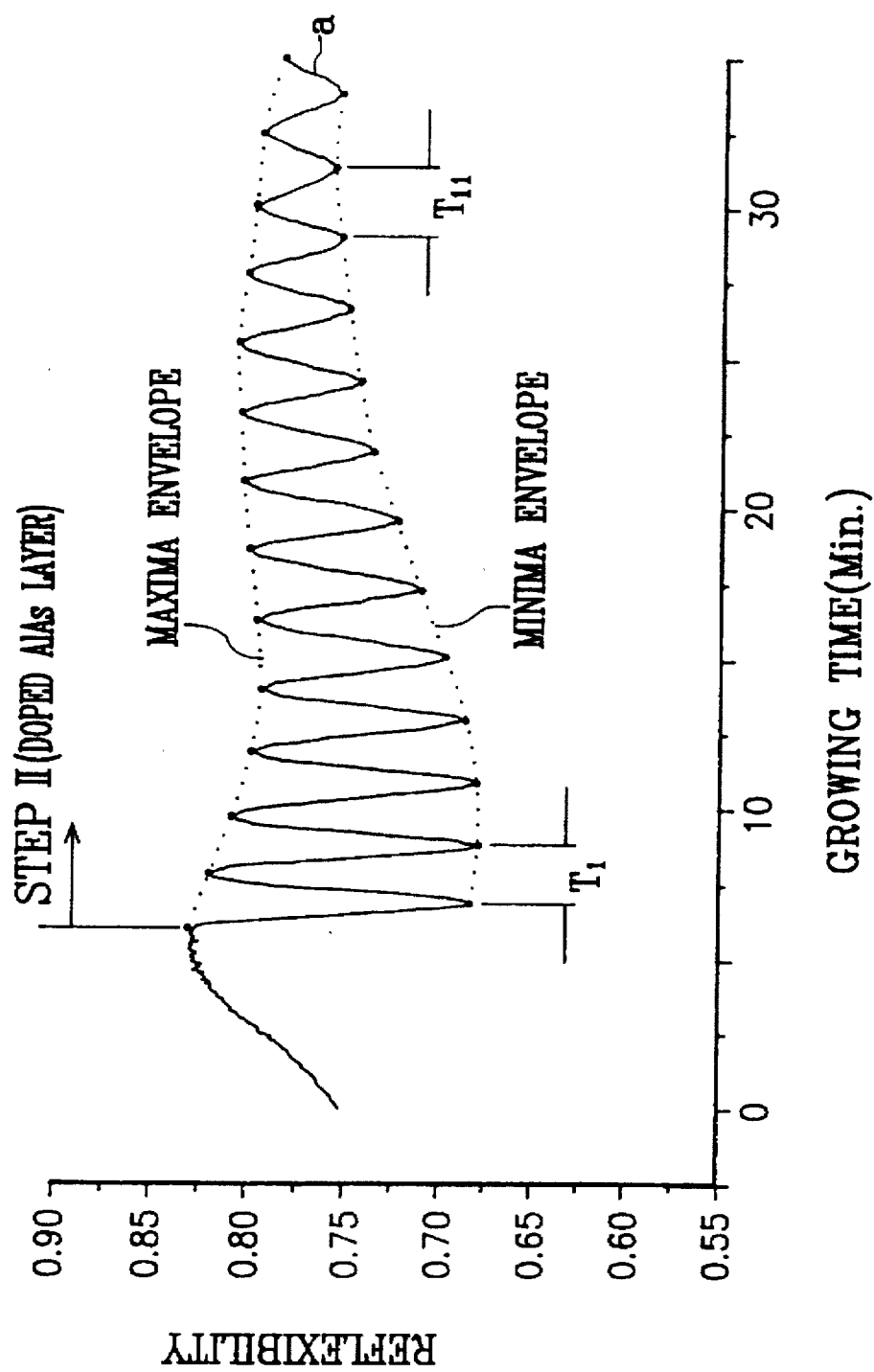
FIG. 4 shows data providing the reflectibility of a reflecting signal of a doped AlAs layer measured by a He—Ne laser.

FIG. 4 shows in detail a reflecting signal to a He—Ne laser of an AlAs layer 132 of step I among graphs in FIG. 3 and an enlarged view for analysis method of the present invention.

A doping characteristic sensing method of a compound semiconductor will be described, with reference to the drawings, as follows.

Laser reflecting signals a and b, as shown in FIGS. 2 and 3, can be obtained by a function formula dependent time, growing an epitaxial layer by a MOCVD method using a real time measuring apparatus shown in FIG. 1A.

At this time, the following relative formula can be obtained.

$$T = \lambda/(2nG)$$

where n is an effective refractive index, G is a growth rate of an epitaxial layer, T is a reflecting signal period, and λ is a laser wavelength.

A growth rate of an epitaxial layer G is measured by an electron microscope, etc. After growth of the layer, it is not necessary to know an accurate value thereof because the invention only invalues the changing of a growth rate.

Utilizing the above formula, since a laser reflecting signal period T is inversely proportional to a growth G, this results in the signal period increasing as the growth rate decreases. Also, the larger the wavelength is, the larger the period is. The period T of a reflecting signal b by means of a diode laser of 1.53 μm wavelength is larger than that of a reflecting signal by means of a He—Ne laser of 0.6328 μm wavelength.

First, FIG. 2 shows a reflectivity according to the growing time in growing a pure AlAs layer 140 and a GaAs layer 150.

When AlAs layer growth processes through step I, some laser beams are reflected from the surface of an epitaxial layer and then enter light detector 20. Some laser beams penetrate through an epitaxial layer and hit on a GaAs layer 130, and are again reflected and enter the detector 20.

Accordingly, an interference occurs due to the phase difference because a path difference between laser beams reflected from the surface of a AlAs layer and a GaAs layer 130 exists after the penetration of the laser beams.

At this time, a compensating interference occurs between the two laser beams when the phase difference of two beams is at the same position by increasing the thickness of an epitaxial layer of an AlAs layer 140, so that a beam strength is at a maximum. On the contrary, an offset interference occurs when the phase difference thereof is at the right reverse position, so that a beam strength is at a minimum. At last, the periodic reflecting signals occur repeating maximum and minimum values. In addition, since the 2nd and 3rd reflection and penetration again occur in the semiconductor layer, signals detected by the detector actually are very complicated. At any rate, a reflecting signal due to an interference has a periodic property.

Also, a GaAs layer 150 of step III has the same phenomenon as described above, only with more complicated reflection and penetration. If an absorption of a beam exists at the epitaxial layer, a period due to interference doesn't appear any more since the penetrated beams don't return back over a constant thickness, gradually reducing an amplitude of a reflecting signal.

Generally, an optical absorption occurs when an energy gap of an epitaxial layer is smaller than energy of a laser beam, that is the lower the energy gap of an epitaxial layer is, the higher a temperature thereof is. Accordingly, because an energy gap of an epitaxial layer is even larger than the energy of a laser, an amplitude of a reflecting signal b of 1.53 μm wavelength does not reduce gradually, having no respect to time for the two epitaxial layers.

However, a reflecting signal due to a He—Ne laser of 0.6328 μm wavelength is not as described above. For a GaAs layer of step III, because an energy gap is smaller than an energy of a laser, an amplitude of a reflecting signal reduces gradually by an absorption, and finally, an interference signal disappears at the seventh peak.

On the other hand, for an AlAs layer, the reducing degree of an amplitude of a reflecting signal a is even weaker as compared to a GaAs layer because an energy gap is similar to the energy of a laser.

In an epitaxial layer being doped with Carbon in the amount of $10^{19}$ per $cm^3$ (about 0.1% concentration per atom), the analysis result of the epitaxial layer doped as described above shows a different aspect as shown in FIG. 3.

First, if a reflecting signal b due to a diode laser is examined, an amplitude of a reflecting signal gradually reduces in a manner different from that of FIG. 2. In other words, this means that an absorption occurs.

In a reflecting signal a due to a He—Ne laser of 0.6328 μm wavelength, the reducing degree thereof gradually increases as compared to FIG. 2. The reducing degree of a signal can be quantified, which will be described in FIG. 4.

Another difference of FIGS. 2 and 3 is that a signal period T increases when doping, and this means that a growth rate reduces. This phenomenon is not a new one. For the reason that a growth rate reduces, it is well known as an established theory that $CCl_4$, a carbon tetra chloride, used as Carbon doping sources reacts to $H_2$ of a carrying gas in a growth chamber, to produce HCl which prevents the growth of an epitaxial layer by etching it.

However, when a reflecting signal a of an AlAs layer 140 produced by means of a He—Ne laser of 0.6328 μm, the 2nd peak period is larger than the 1st peak period, and the difference thereof gradually increases in the latter half of the growth.

FIG. 4 shows in detail a reflecting signal a due to a He—Ne laser of 0.6328 μm of an AlAs layer 140 of step III and is an enlarged view to explain an analysis method of the present invention. The quantitative counting method of the reduction degree of a reflecting signal is equal to the counting method of an absorption coefficient. The absorption coefficient means that a beam strength reduces by an exponent function at the position which a laser beam moves by a constant distance p, and at this position, the beam strength is expressed as follows.

$$\{Imax(p)-Imini(p)\}=\{Imax(o)-Imini(o)\} \exp(-\alpha p)$$

where p is the moving distance of a beam and relates to the thickness of an epitaxial layer.

Imax(p) and Imini(p) are function values substituting maximum value and minimum value of reflecting signals at the position p, respectively. The absorption coefficient is $\alpha$. That is, the larger the absorption coefficient $\alpha$ is, the more rapidly the beam strength decreases, and when $\alpha$ is minimal, the strength doesn't decrease any more and has a constant value.

As an aspect of the present invention, it is considered that the coefficient $\alpha$ changes according to the concentration of an impurity. The impurity forms a constant energy level within the energy band of an epitaxial layer, which results in an absorption through the energy level of the impurity even if the energy of a laser beam is lower than the energy band of the epitaxial layer.

The stronger the concentration of an impurity, the higher the absorption. In an experiment that the doping concentration of carbon is reduced to half by verify the present invention, the laser reflection signal is found to be an absorption of a middle energy level.

As described above, the merit of the present invention is in that the concentration of an impurity can be obtained with in a real time instantly by using a non-destructive test during the growth of the epitaxial layer. On the contrary, it has some problems that the distribution of the concentration of an impurity according to the thickness cannot be obtained and the impurity of low concentration is not detected at all.

A careful observation of the peak periods among the reflection signals in FIG. 4 reveals that the period of peak 1 (T1) is shorter than those of peaks 2 and 3, and the difference between the periods becomes so remarkable that the period of peak 1 is shorter than that of peak 11 (T11) by about 30%. This means that the growth rate gradually decreases with the progress of the growth from the early period, a fact which is not sensed by other prior art methods but is known according to the present invention.

While the conventional analysis method for the concentration of an impurity can be applied only after prescribed advance preparations as destructive or non-destructive tests, the embodiment of the present invention has advantages in that it is possible to accurately regulate the doping concentration because the doping characteristic of an impurity can be obtained immediately during the experiment, which can improve the characteristic of a device and the productivity.

Additionally, the present invention enables the formation of a good-quality compound semiconductor layer because an epitaxial layer can be modified much more precisely due to an understanding of the increase and decrease in the growth velocities.

Although the present invention has been described above with reference to the preferred embodiments thereof, those skilled in the art will readily appreciate that various modifications and substitutions can be made thereto without departing from the spirit and scope of the invention as set forth in the appended claims.

What is claimed is:

1. A method of sending the doping characteristic of a compound semiconductor in real time, said method comprising the steps of:

epitaxially growing a compound semiconductor in a growth chamber of an epitaxy apparatus;

injecting a reactive gas in said growth chamber;

growing a heterostructure compound semiconductor layer;

simultaneously scanning a He—Ne laser beam and a diode laser beam from a laser apparatus onto the surface of a compound semiconductor in said growth chamber;

analyzing a laser beam reflected and a refraction ratio of an epitaxial layer; and analyzing the doping concentration and growth rate of a compound semiconductor grown in real time.

2. The method according to claim 1, wherein said growth rate is obtained by the formula of $G\lambda/2nT$, wherein G is the growth rate, $\lambda$ is a wavelength of a laser, n is an effective refractive index of an epitaxial layer grown, and T is a period of a reflecting signal.

3. The method according to claim 1, wherein said heterostructure compound semiconductor is performed by an epitaxy process of two steps of forming an AlAs layer and a GaAs layer.

4. The method according to claim 2, wherein said growth rate is obtained by using any one of a He—Ne laser or a diode laser.

5. The method according to claim 1, wherein said doping characteristic is measured by an absorption coefficient of a laser beam of a grown epitaxial layer.

* * * * *